(12) United States Patent
Yeh

(10) Patent No.: US 7,649,794 B2
(45) Date of Patent: Jan. 19, 2010

(54) WEAR LEVELING METHOD AND CONTROLLER USING THE SAME

(75) Inventor: Chih-Kang Yeh, Kinmen County (TW)

(73) Assignee: Phison Electronics Corp., Hsinchu (TW)

( * ) Notice: Subject to any disclaimer, the term of this patent is extended or adjusted under 35 U.S.C. 154(b) by 198 days.

(21) Appl. No.: 12/013,632

(22) Filed: Jan. 14, 2008

(65) Prior Publication Data

US 2009/0091978 A1    Apr. 9, 2009

(30) Foreign Application Priority Data

Oct. 9, 2007    (TW) ................. 96137831 A

(51) Int. Cl.
*G11C 7/00*    (2006.01)

(52) U.S. Cl. ............ 365/218; 365/230.03; 365/230.08; 365/189.09

(58) Field of Classification Search ................. 365/218, 365/230.03, 230.08, 189.09
See application file for complete search history.

(56) References Cited

U.S. PATENT DOCUMENTS 6,762,969 B2 * 7/2004 Sasaki et al. ............. 365/225.7

* cited by examiner

*Primary Examiner*—Thong Q Le
(74) *Attorney, Agent, or Firm*—J.C. Patents

(57) ABSTRACT

A wear leveling method under limited system resources is provided, the wear levelling method is suitable for a non-volatile memory, the non-volatile memory is substantially divided into a plurality of blocks, and the blocks are at least grouped into a data area, a spare area and a substitution-transient area. The blocks within the data area may be divided into a plurality of lately-used blocks and a plurality of lately-unused blocks. The method includes only recording erase times of the lately-used blocks and blocks within the spare area and selecting a block used for the substitution-transient area is selected from the spare area according to a judgment condition of erase times of another block within the spare area plus a first threshold value. The method also includes performing a wear leveling procedure. Wherein, the selected block and the other block are selected in a random mode or a sequential mode.

26 Claims, 6 Drawing Sheets

WEAR LEVELING METHOD AND CONTROLLER USING THE SAME

CROSS-REFERENCE TO RELATED APPLICATION

This application claims the priority benefit of Taiwan application serial no. 96137831, filed on Oct. 9, 2007. The entirety of the above-mentioned patent application is hereby incorporated by reference herein and made a part of this specification.

BACKGROUND OF THE INVENTION

1. Field of the Invention

The present invention relates to a wear leveling method. More particularly, the present invention relates to a wear leveling method for a non-volatile memory and a controller using the same.

2. Description of Related Art

With a quick developing of digital camera, cell phone camera and MP3, demand of storage media by customers is increased greatly. Since a flash memory has the advantages of non-volatile, energy saving, small size and none mechanical structure etc., it is suitable for portable applications, and especially for portable battery-powered products. Besides a demand of built-in memories of the portable products, demand of the flash memories used for external products such as small memory cards and flash drives is increased greatly in the market, since a user may simultaneously own a plurality of the memory cards and the flash drives. Therefore, the flash drive industry becomes a hot industry within the electronics industry recently.

Though the flash drive has the advantages of programmable, erasable, data saving after power-off, erase times of memory blocks within the flash memory are limited. For example, the memory blocks may be worn after ten thousand times of erase. When wearing of the memory blocks causes a loss of storage volume or an obvious decreasing of performance, the adverse effects such as loss of the stored data or unable of storing data may be occurred.

Wearing of the flash memory blocks is determined by program and erase times of each block. Namely, if a block is only programmed (or written) for once, and none programming is performed afterwards, wearing of the block is relatively low. Conversely, if the block is repeatedly programmed and erased, wearing of the block is relatively high. For example, if a host for accessing the memory blocks repeatedly performs programming by using a same logical block address, the block with the same physical address within the flash memory may be programmed and erased repeatedly.

When some blocks are worn, and meanwhile some other blocks are relatively not, the worn blocks may generally decrease the performance of the flash drive. Besides a performance decreasing of the worn blocks itself, if the unworn blocks are not sufficient for storing data, the whole performance of the flash drive decreases accordingly. Namely, when a number of the worn blocks of the flash drive is greater than a threshold value, even if there are still other unworn blocks, the flash drive is judged to be useless. When the unworn blocks are regarded useless, it is actually a waste of resources.

To prolong a lifespan of the flash drive, utilization of the blocks in the flash drive should be leveled. Generally, the blocks of the flash drive are grouped into a data area and a spare area. According to a conventional wear leveling method, when the flash drive is operated for a period of time, the blocks within the data area and the blocks within the spare area are logically exchanged sequentially, hopefully the blocks with lesser erase times may be exchanged to the data area for being programmed (or written). However, such method for logically exchanging the blocks within the data area sequentially to the blocks within the spare area cannot ensure the exchanged blocks are those with lesser erase times, and if the exchanged blocks are those with greater erase times, wearing of the blocks may be accelerated, and therefore an effect of the conventional wear leveling method is limited.

Accordingly, a novel wear leveling method is required to effectively prolong the lifespan of the flash drive.

SUMMARY OF THE INVENTION

The present invention is directed to a wear leveling method for a non-volatile memory, which may effectively level wearing of memory blocks, so as to prolong a lifespan of the memory.

The present invention is directed to a controller, by which a wear levelling method for a non-volatile memory may be applied, so as to effectively level wearing of memory blocks for prolonging a lifespan of the memory.

The present invention provides a wear leveling method under limited system resources for a non-volatile memory, by which the non-volatile memory is substantially divided into a plurality of blocks, and the blocks are at least grouped into a data area, a spare area and a substitution-transient area. The blocks within the data area may be divided into a plurality of lately-used blocks and a plurality of lately-unused blocks. The method includes: a. recording erase times of the lately-used blocks and blocks within the spare area; b. when a block used for the substitution-transient area from the spare area according to a judgment condition of erase times of another block within the spare area plus a first threshold value; and c. performing a wear leveling procedure. Wherein, the selected block and the other block are selected in a random mode or a sequential mode.

In an embodiment of the present invention, the aforementioned step of selecting the block according to the judgment condition include: moving the selected block to the substitution-transient area if the erase times of the selected block≦the erase times of the other block within the spare area plus the first threshold value; and moving the other block to the substitution-transient area if the erase times of the selected block≦the erase times of the other block within the spare area plus the first threshold value.

In an embodiment of the present invention, the aforementioned wear leveling procedure includes: selecting a block from the spare area; exchanging the selected block with one of the lately-unused blocks if the erased times of the selected block>the erase times of the other block within the spare area plus the first threshold value; and exchanging the other block with one of the lately-unused blocks if the erase times of the selected block≦the erase times of the other block within the spare area plus the first threshold value.

In an embodiment of the present invention, the aforementioned wear leveling method further includes: adding 1 to a counting value if the erase times of the block with a maximum erase times within the spare area>an average value between a maximum erase times and a minimum erase times among the erase times of the lately-used blocks plus a second threshold value; and performing the step c. and resetting the counting value if the counting value is greater than a third threshold value.

In an embodiment of the present invention, the aforementioned wear leveling method further includes: adding 1 to the counting value when a write or an erase instruction is implemented; and performing the step c. and resetting the counting value if the counting value is greater than the third threshold value.

In an embodiment of the present invention, the aforementioned wear leveling method further includes: performing the step c. if the erase times of the block with the maximum erase times within the spare area>the average value between the maximum erase times and the minimum erase times among the erase times of the lately-used blocks plus a fourth threshold value.

In an embodiment of the present invention, the aforementioned wear leveling method further includes: performing the step c. in a random mode.

In an embodiment of the present invention, the aforementioned wear leveling method further comprises: increasing the erase times of the erased block when the block is erased.

In an embodiment of the present invention, the step of recording the erase times of the lately-used blocks and the blocks within spare area is performed in a system area which the blocks further are grouped into.

In an embodiment of the present invention, the aforementioned wear leveling method further includes: performing the step c. by implementing a normal write instruction.

In an embodiment of the present invention, the step of selecting one of the lately-unused blocks is performed in a sequential mode or a random mode.

The present invention provides a controller for a storage device, wherein a non-volatile memory of the storage device is substantially divided into a plurality of memory blocks, and the memory blocks are at least grouped into a data area, a spare area and a substitution-transient area, and the memory blocks within the data area may be divided into a plurality of lately-used blocks and a plurality of lately-unused blocks. The controller includes a non-volatile memory interface, a buffer memory, a microprocessor unit and a memory management module. The non-volatile memory interface is used for accessing the non-volatile memory. The buffer memory is used for temporarily storing data. The microprocessor is used for controlling a whole operation of the controller. The memory management module is used for managing the non-volatile memory, wherein the memory management module records erase times of the lately-used blocks and blocks within the spare area, selects the block for the substitution-transient area from the spare area according to a judgment condition of erase times of another block within the spare area plus a first threshold value and performs a wear leveling procedure, and the selected block and the other block are selected in a random mode or a sequential mode.

In an embodiment of the present invention, the aforementioned selecting the block according to the judgment condition by the memory management module includes: moving the selected block to the substitution-transient area if the erase times of the selected block≦the erase times of the other block within the spare area plus the first threshold value; and moving the other block to the substitution-transient area if the erase times of the selected block>the erase times of the other block within the spare area plus the first threshold value.

In an embodiment of the present invention, the aforementioned wear leveling procedure includes: selecting a block from the spare area, exchanging the selected block with one of the lately-unused blocks if the erased times of the selected block>the erase times of the other block within the spare area plus the first threshold value; and exchanging the other block with one of the lately-unused blocks if the erase times of the selected block≦the erase times of the other block within the spare area plus the first threshold value.

In an embodiment of the present invention, the aforementioned wear leveling procedure further includes: adding 1 to a counting value if the erase times of the block with a maximum erase times within the spare area>an average value between the maximum erase times and a minimum erase times among the erase times of the lately-used blocks plus a second threshold value; and performing the step c. and resetting the counting value if the counting value is greater than a third threshold value.

In an embodiment of the present invention, the aforementioned memory management module adds 1 to a counting value when a write or an erase instruction is implemented, and performs the step c. and resets the counting value if the counting value is greater than the third threshold value.

In an embodiment of the present invention, the aforementioned memory management module performs the step c. if the erase times of the block with a maximum erase times within the spare area>the average value between the maximum erase times and the minimum erase times among the erase times of the lately-used blocks plus a fourth threshold value.

In an embodiment of the present invention, the aforementioned memory management module performs the step c. in a random mode.

In an embodiment of the present invention, the aforementioned memory management module increases the erase times of the erased block when the block is erased.

In an embodiment of the present invention, the aforementioned memory management module records the erase times of the lately-used blocks and the blocks within spare area in a system area which the blocks further are grouped into.

In an embodiment of the present invention, the aforementioned memory management module performs the step c. by implementing a normal writing instruction.

In an embodiment of the present invention, one of the aforementioned memory management module selects one of the lately-unused blocks in a sequential mode or a random mode.

In an embodiment of the present invention, the aforementioned non-volatile memory includes a SLC NAND flash memory and a MLC NAND flash memory.

The present invention provides a wear leveling method under limited system resources for a non-volatile memory, wherein the non-volatile memory is substantially divided into a plurality of blocks, and the blocks are at least grouped into a data area and a spare area. The blocks within the data area may be divided into a plurality of lately-used blocks and a plurality of lately-unused blocks. The wear leveling method includes: only managing and recording erase times of the lately-used blocks and blocks within the spare area in a buffer memory; and performing a wear leveling procedure.

In an embodiment of the present invention, the aforementioned lately-used blocks are those blocks within the data area that write or erase is lately performed.

The present invention provides a controller for a storage device, wherein a non-volatile memory of the storage device is substantially divided into a plurality of memory blocks, and the memory blocks are at least grouped into a data area and a spare area. The blocks within the data area may be divided into a plurality of lately-used blocks and a plurality of lately-unused blocks. The controller includes a non-volatile memory interface, a buffer memory, a microprocessor unit and a memory management module. The non-volatile memory interface is used for accessing the non-volatile memory. The buffer memory is used for temporarily storing data. The microprocessor is used for controlling a whole operation of the controller. The memory management module is used for managing the non-volatile memory, wherein a wear leveling method is applied to the memory management module. The memory management module only manages and records erase times of the lately-used blocks and blocks within the spare area in a buffer memory, and performs a wear leveling procedure.

The present invention provides a wear leveling method for a non-volatile memory, which may effectively level wearing of memory blocks, so as to prolong a lifespan of the memory.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

A non-volatile memory storage system generally includes a non-volatile memory and a controller (control chip). The non-volatile memory storage system is generally used together with a host, such that the host may write data into the non-volatile memory storage system or read data from the non-volatile memory storage system. Moreover, the non-volatile memory storage system may include a built-in non-volatile memory and software that may be executed on the host and substantially functions as a controller of the built-in flash memory.

Figure 1A:
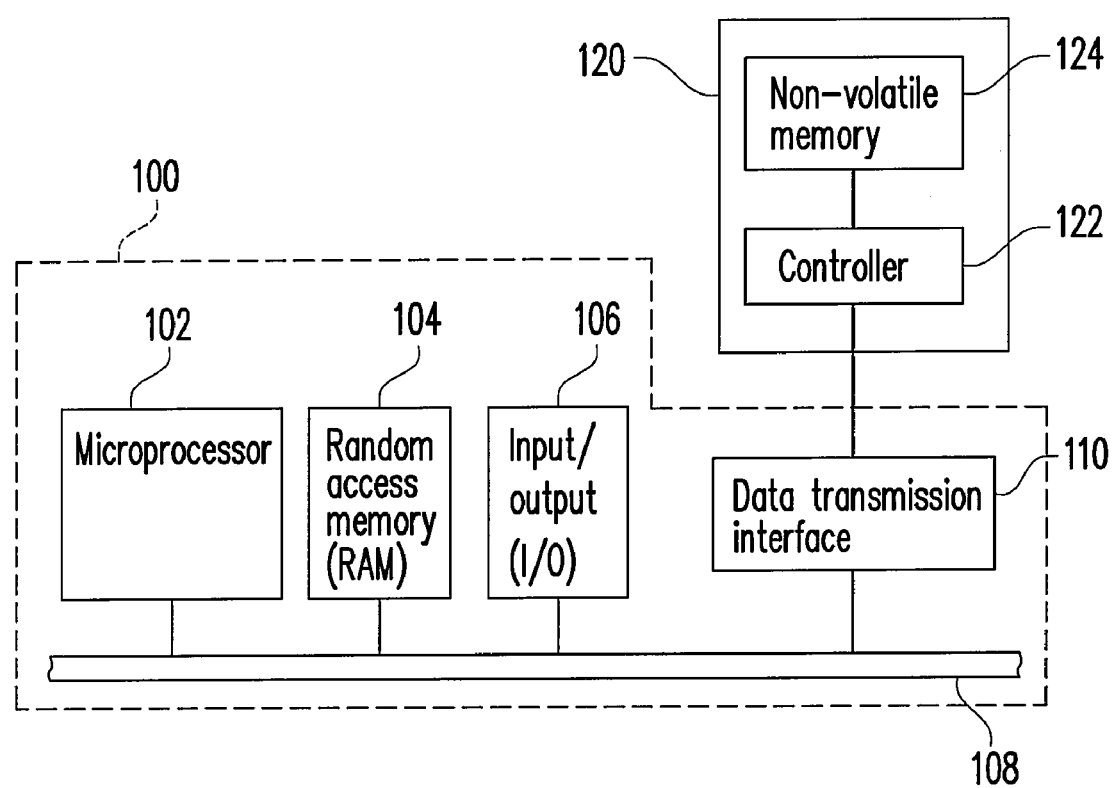
FIG. 1A is a diagram illustrating a host using a non-volatile memory storage device according to an embodiment of the present invention.

FIG. 1A is a diagram illustrating a host using a non-volatile memory storage device according to an embodiment of the present invention.

Referring to FIG. 1A, the host 100 includes a microprocessor 102, a random access memory (RAM) 104, an input/output (I/O) device 106, a system bus 108 and a data transmission interface 110. It should be understood by those skilled in the art that the host 100 may further include other devices such as a display device or a network device etc.

The host 100 may be a computer, a digital camera, a video camera, a communication apparatus, an audio player, or a video player etc. Generally, the host 100 may be any system that may store data.

A non-volatile memory storage device 120 of the present embodiment is electrically connected to the components of the host 100 via the data transmission interface 110. By processing of the microprocessor 102, the RAM 104 and the I/O device 106, data may be written into the non-volatile memory storage device 120 or read from the non-volatile memory storage device 120.

Figure 1B:
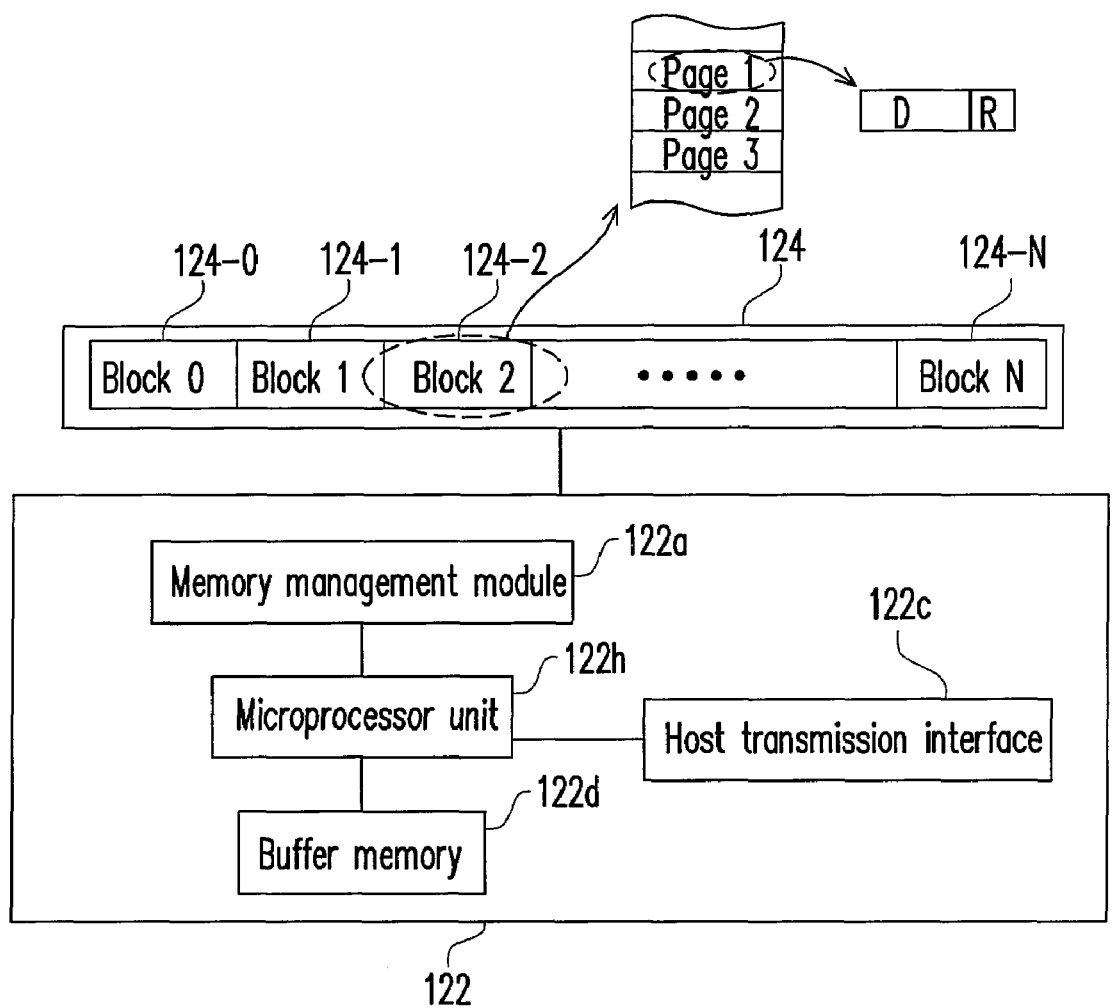
FIG. 1B is a detailed block diagram of the non-volatile memory storage device of FIG. 1A.

FIG. 1B is a detailed block diagram of the non-volatile memory storage device of FIG. 1A.

Referring to FIG. 1B, the non-volatile memory storage device 120 generally includes a controller 122 and a non-volatile memory 124.

The controller 122 is used for controlling the whole operation of the non-volatile memory storage device 120, such as storing of data, reading of data and erasing of data etc. The controller 122 includes a memory management module 122a, a non-volatile memory interface 122b, a buffer memory 122d and a microprocessor unit 122h.

The memory management module 122a is used for managing the non-volatile memory 124, such as executing a wear leveling function, managing bad blocks, maintaining a mapping table etc.

The non-volatile memory interface 122b is used for accessing the non-volatile memory 124. Namely, the data to be written by the host 100 is transformed into a format which may be identified by the non-volatile memory 124 via the non-volatile memory interface 122b.

The microprocessor unit 122h is used for controlling the whole operation of the controller 122.

The buffer memory 122d is used for temporarily storing the system data (for example, the mapping table) or the data read or written by the host. In the present embodiment, the buffer memory 122d is a static random access memory (SRAM). However, the present invention is not limited thereof, it should be understood that a dynamic random access memory (DRAM), a magnetic random access memory (MRAM), a phase-change random access memory (PRAM) or other suitable memories may also be applied in the present invention.

Figure 1C:
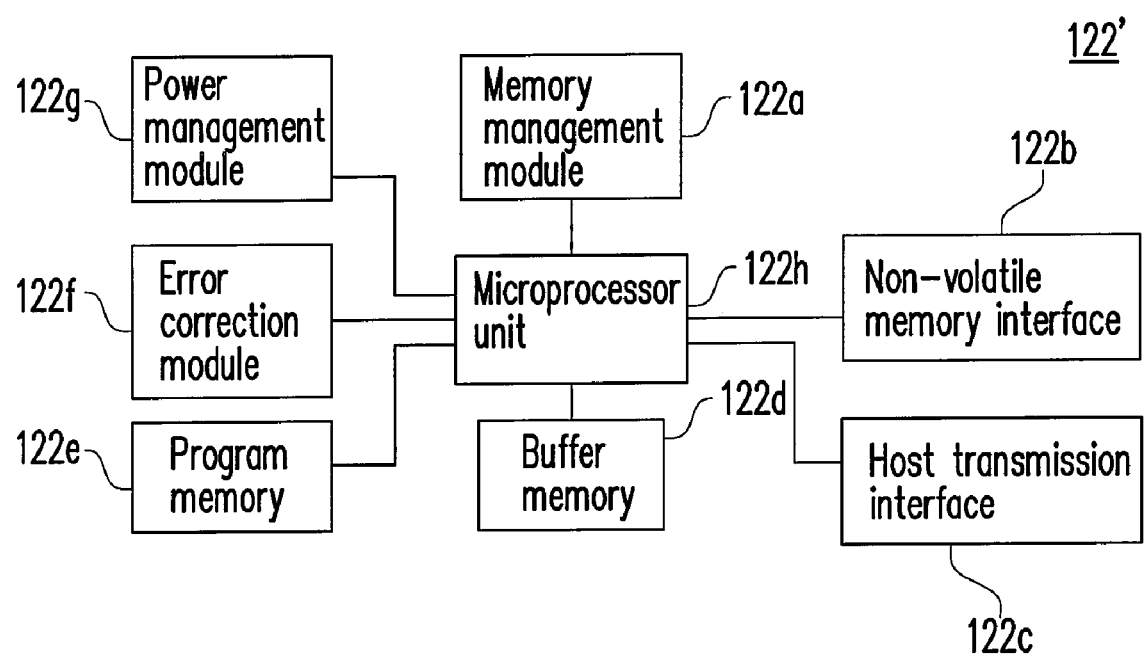
FIG. 1C is a detailed block diagram of a controller according to another embodiment of the present invention.

In another embodiment of the present invention, the controller 122' may further include a host transmission interface 122c, a program memory 122e, an error correction module 122f and a power management module 122g (shown as FIG. 1C).

The host transmission interface 122c is used for communicating with the host 100, and the host transmission interface 122c may be a USB interface, an IEEE 1394 interface, a SATA interface, a PCI express interface, a MS interface, a MMC interface, a SD card interface, a CF card interface or a IDE interface.

The program memory 122e is used for storing the program code to be executed by the controller for controlling the non-volatile memory storage device 120.

The error correction module 122f is used for calculating an error correcting code to check and correct the data read or written by the host.

The power management module 122g is used for managing the power supply of the non-volatile memory storage device 120.

The non-volatile memory 124 is used for storing the data. In the present embodiment, the non-volatile memory 124 is a flash memory. More particularly, the non-volatile memory 124 is a multi level cell (MLC) NAND flash memory. However, the present invention is not limited thereof, the non-volatile memory 124 may also be a single level cell (SLC) NAND flash memory.

The non-volatile memory 124 is substantially divided into a plurality of physical blocks 124-0~124-N. For convenience, the physical blocks are referred to as blocks below. Generally, the block is a minimum unit that may be erased within the flash memory. Namely, each block contains a minimum number of memory cells that may be erased together. Each block is generally divided into a plurality of pages, and the page is the minimum unit that may be programmed. It should be noted that according to different designs of the flash memory, the minimum programmable unit may also be a sector, namely, the page may be divided into a plurality of the sectors, and the sector is the minimum unit that may be programmed. In other words, the page is the minimum unit that data may be written on or read from. Each page generally includes a user data area D and a redundant area R. The user data area is used for storing a user data, and the redundant area is used for storing a system data (for example, the aforementioned error correcting code).

To cope with a size of the sector of the disk drive, the user data area D is generally 512 bytes, and the redundant area is generally 16 bytes. Namely, one page is one sector. However, the page may also include a plurality of the sectors, for example, one page may include 4 sectors. Generally, the block may include arbitrary number of pages, for example, 64 pages, 128 pages, 256 pages etc. The blocks 124-0~124-N are generally grouped into a plurality of zones, and managing of the memory based on the zones results in the fact that the zones may be operated independently, so as to increase a parallel degree of operation, and simplify a complexity of management.

When some blocks of the non-volatile memory 124 are continuously programmed (for example, repeatedly written and erased), these blocks may be worn more quickly than those blocks without being continuously programmed. To effectively level wearing of the blocks within the non-volatile memory 124, the wear leveling method of the present invention may be applied, by which utilization of the blocks being continuously programmed may be automatically decreased, and the blocks without being continuously programmed may be automatically utilized, such that a lifespan of the non-volatile memory 124 may be prolonged.

Operation of the non-volatile memory will now be described more fully with reference to the accompanying drawings. It should be understood that the terms used herein such as "select", "move", "exchange" etc. for operating the blocks of the flash memory are only logical concepts. Namely, the blocks of the flash memory are only operated logically, and actual positions of the blocks are not changed.

Figure 2A:
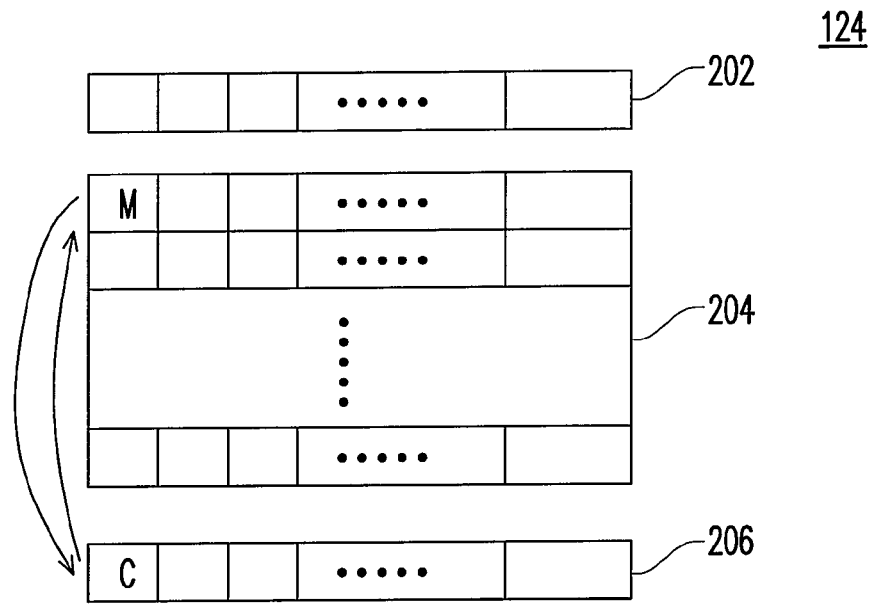
FIGS. 2A and 2B are detailed block diagrams illustrating a non-volatile memory and operation methods thereof according to the first embodiment of the present invention.
Figure 2B:
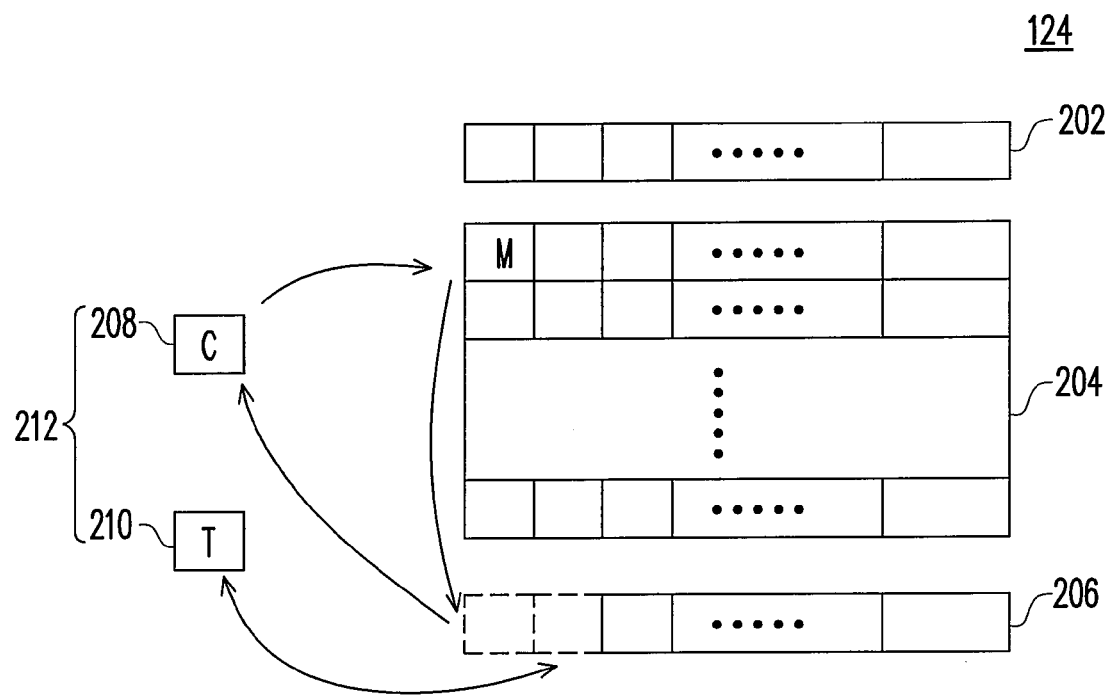

FIGS. 2A and 2B are detailed block diagrams of the non-volatile memory 124 and operation methods thereof according to an embodiment of the present invention.

Referring to FIG. 2A, in the present embodiment, to effectively program (i.e. write and erase) the non-volatile memory 124, the blocks 124-1~124-N of the non-volatile memory 124 may be logically grouped into a system area 202, a data area 204 and a spare area 206. Generally, the data area 204 may occupy 90% area of the non-volatile memory 124.

The blocks of the system area 202 are used for recording the system data, such as area number of the non-volatile memory 124, block number within each area, page number within each block and a logical physical mapping table etc.

The blocks of the data area 204 are used for storing the user data, and the blocks generally map to the logical block addresses operated by the host 100.

The blocks of the spare area 206 are used for substituting the blocks of the data area 204. Therefore, the blocks of the spare area 206 are empty blocks, namely, no data or data has been marked invalid is stored therein. More particularly, if data is about to be written to the locations with data thereon, erasing of the existing data has to be performed first. However, as mentioned above, the page is the minimum writable unit, and the block is the minimum erasable unit. The minimum erasable unit is greater than the minimum writable unit, which represents if the block is about to be erased, effective pages within the block have to be copied to another block first. Therefore, when a new data is about to be written to a block M written with data within the data area 204, a block C is generally selected from the spare are 206, and then effective data written on the block M is copied to the block C and the new data is written on the block C. Next, the block M is erased and moved to the spare area 206, meanwhile, the block C is moved to the data area 204 (as shown in FIG. 2A), which means the block M is logically associated to the spare area 206, and the block C is logically associated to the data area 204. It should be understood by those skilled in the art that logical relationships of the blocks within the data area 204 may be maintained by the logical physical mapping table.

In the present embodiment, to effectively utilize the non-volatile memory 124, the blocks 124-1~124-N are further logically grouped into a substitution-transient area 212 including a substitution area 208 and a transient area 210.

Referring to FIG. 2B, the substitution area 208 is used for temporarily storing the blocks used for substituting the blocks of the data area 204. To be specific, when a block C of the spare area 206 is selected for substituting the block M of the data area 204, in the present embodiment, the new data is written to the block C, however, the effective data stored on the block M may not be moved to the block C immediately and the block M may not be erased immediately. This is because the effective data on the block M may be turned to invalid during a next operation. Therefore, immediate movement of the effective data on the block M to the physical block C is unnecessary. In the present embodiment, the block C written with the new data may be temporarily associated to the substitution area, and a situation of a plurality of the physical block addresses mapping to one logical block address may be recorded, namely, integration of the data on the block M and the block C is the data on the mapped logical block, such that utilization efficiency of the blocks is improved. The relationship of mother and son blocks (block M and block C) may be determined by the size of the buffer memory 122*d* within the controller 122, and five groups are taken as an example in the present embodiment.

The function of the transient area 210 is similar to that of the substitution area 208. As described above, the MLC NAND flash memory is applied in the present embodiment, and one page of the MLC NAND flash memory may include 4 sectors, i.e. one page includes four 512 bytes sectors, and 2K bytes in total. As described above, the page is the minimum unit that may be programmed, and therefore each time 4 sectors has to be programmed when the MLC NAND flash memory is applied, which may cause a waste when a small amount of data is written thereon. In the present embodiment, the transient area 210 is used for temporarily storing such small amount of data. To be specific, if the data to be written to the block C of the substitution area 208 is the small amount of data which is less than one page, a block T is selected from the spare area 206, and such small amount of data is written to the block T and the block T is associated to the transient area 210. Then, when the follow-up written data is enough to fill up one page, these data is written to the block C, and the block T is erased and moved to the spare area 206 from the transient area 210.

Generally, the blocks frequently exchanged between the data area 204 and the spare area 206 is referred to as dynamic data blocks. In the present embodiment, designs of the substitution area 208 and the transient area 210 are used for improving the utilization efficiency of the dynamic data blocks. Moreover, some data written in the data area 204 may keep unchanged for a long time, for example, a user may store 100 favourite MP3 songs within the data area 204, and the stored MP3 songs may keep unchanged for a long time. The blocks used for storing such kind of data are referred to as static data blocks. Erase times of the static data blocks may be relatively low due to little change of the stored data. In the present embodiment, the memory management module 122a of the controller 122 may implement the wear leveling method to effectively level wearing of the blocks 124-1~124-N.

Figure 3:
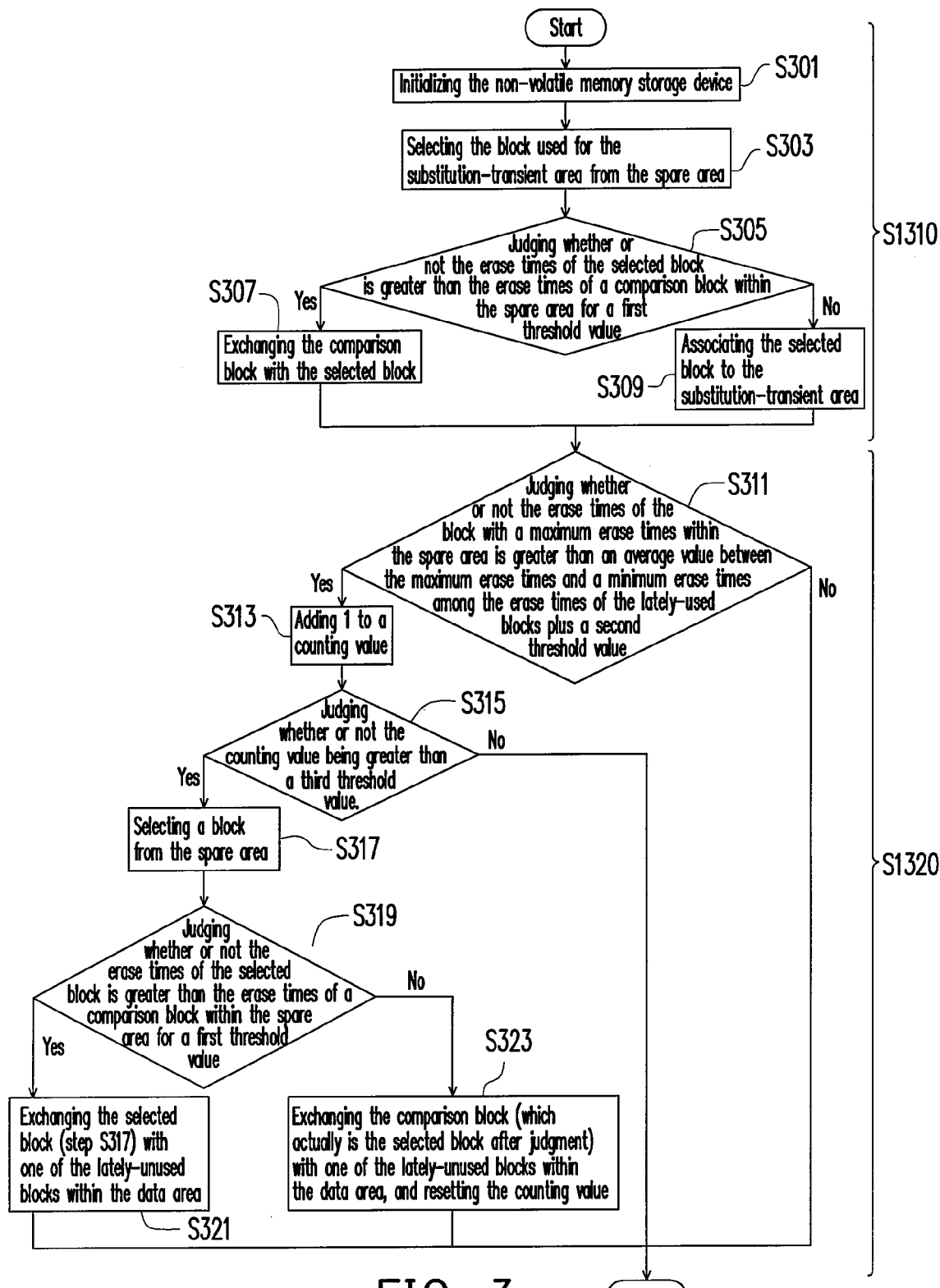
FIG. 3 is a flowchart illustrating a wear leveling method according to an embodiment of the present invention.

FIG. 3 is a flowchart illustrating a wear leveling method (function). When the wear leveling method is applied for programming the memory blocks, the memory blocks may be evenly utilized to achieve the wear leveling effect. The wear leveling method of the present embodiment includes selecting a block used for the substitution-transient area 212 from the spare area based on a judgment condition (step 1310); and performing a wear leveling procedure (step S1320). The wear leveling method is described in detail below accompanying with a drawing of FIG. 3.

Referring to FIG. 3, to level wearing of the blocks, the erase times of the blocks 124-1~124-N within the non-volatile memory 124 are generally recorded. However, considering a system burthen, the blocks of the data area are divided into a plurality of lately-used blocks and a plurality of lately-unused blocks according to the present embodiment of the present invention, and in step S301, when the non-volatile memory storage device 120 is initialized, only erase times of the lately-used blocks and blocks within the spare area and the substitution-transient area are recorded to the buffer memory 122d. Since the erase times of only a part of the blocks not all of the blocks are recorded in the present embodiment, the system burthen may be mitigated, and wear leveling effect may be achieve. In the present embodiment, the lately-used blocks are 100 blocks being lately erased or written. However, it should be noted that in another embodiment of the present invention, the number of the lately-used blocks may be varied according to a design requirement. To be specific, if information of the erase times are not stored within the system area 202 of the non-volatile memory 124, the information is re-established, and if the information of the erase times has been stored within the system area 202, the information is loaded to the buffer memory 122d of the controller 122.

It should be noted that the erase times recorded within the buffer memory 122d are continuously renewed each time when a block is erased during operation of the non-volatile memory storage device, for example, the information may be recorded in the blocks within the system area 202 when operation of the non-volatile memory storage device 120 is completed, or may be periodically recorded in the blocks within the system area 202 during operation of the non-volatile memory storage device 120, such that losing of the renewed information due to abnormal power-off may be avoided.

In step S303, the block used for the substitution-transient area 212 (i.e. the substitution area 208 and the transient area 210) is selected from the spare area 206. Namely, when a write instruction is received, the memory management module 122a of the controller 122 may select the block from the spare area 206 for programming. Next, in step S305, the erase times of the selected block is judged whether or not being greater than the erase times of any block within the spare area for a first threshold value. To be specific, the memory management module 122a of the controller 122 compares the erase times of the selected block to the erase times of another block selected from the spare area in a random mode or a sequential mode (which is referred to as a comparison block), and judges whether or not the erase times of the selected block is greater than the erase times of the comparison block for the first threshold value. In the present invention, the first threshold value is determined based on the wear leveling effect to be achieved. In the present embodiment, the first threshold value may have a range of 10~50, wherein 20 is an optimal value.

In the step S305, if the erase times of the selected block is greater than the erase times of the comparison block for the first threshold value, in step S307, the comparison block is then exchanged with the selected block, and the comparison block is associated to the substitution-transient area 212, and meanwhile, the association between the comparison block and the spare area 206 is cancelled. Namely, the comparison block is selected for being applied to the substitution-transient area 212, and the original selected block with a relatively greater erase times is left in the spare area 206. Conversely, in step S309, the selected block is associated to the substitution-transient area 212, and meanwhile, the association between the selected block and the spare area 206 is cancelled. Namely, when the block used for the substitution-transient area 212 is about to be selected from the spare area, the blocks with relatively high erase times (i.e. frequently used blocks) will not be selected, such that frequent utilization of high wearing blocks may be avoided.

According to the wear leveling method, besides the block used for the substitution-transient area 212 is selected from the spare area based on a judgment condition, a wear leveling procedure is further performed (step S1320). In the present embodiment, the wear leveling procedure includes exchanging the block within the data area with the block within the spare area, so as to level utilization of the blocks. In the present embodiment, the lately-unused block within the data area is exchanged with the block with higher erase times within the spare area. Detailed operations thereof will be described below with reference to a drawing of FIG. 3.

Referring to FIG. 3, each time after the block used for the substitution-transient area 212 is selected from the spare area 206, whether or not the erase times of the block with a maximum erase times within the spare area 206 is greater than an average value between a maximum erase times and a minimum erase times among the erase times of the lately-used blocks plus a second threshold value is then judged (step S311). To be specific, the memory management module 122a of the controller 122 compares the erase times of the block with a maximum erase times within the spare area 206 to the average value between the maximum erase times and the minimum erase times among the erase times of the lately-used blocks (i.e. (the maximum erase times+the minimum erase time)/2), and judges whether or not the erase times of the block with the maximum erase times within the spare area 206 is greater than the average value between the maximum erase times and the minimum erase times among the erase times of the lately-used blocks for the second threshold value. In the present invention, the second threshold value is determined based on the wear leveling effect to be achieved. In the present embodiment, the second threshold value may be any positive number which satisfy the condition that a calculating value of ((the maximum erase times+the minimum erase time)/2+the second threshold value) being greater than the average value of the maximum erase times and the minimum erase times, and less than the maximum erase times.

If in the step S311, the erase times of the block with the maximum erase times within the spare area 206 is judged to be greater than the average value between the maximum erase times and the minimum erase times among the erase times of the lately-used blocks for the second threshold value, in step S313, a counting value is then added 1 and stored in the buffer memory 122d. The counting value is used for counting the number of times that judgment condition of the S311 being satisfied.

In step S315, the counting value is judged whether or not to be greater than a third threshold value. Wherein, the third threshold value is determined based on the wear leveling effect to be achieved, which may be any positive number, and in the present embodiment, the third threshold value is assumed to be 10. If the counting value is judged to be greater than the third threshold value according to the step S315, in step S317, a block is then selected from the spare area 206, and in step S319, whether or not the erase times of the selected block is greater than the erase times of the comparison block randomly or sequentially selected from the spare area 206 plus the first threshold value is then judged. If the erase times of the selected block is judged to be greater than the erase times of the comparison block selected from the spare area 206 plus the first threshold value according to the step S319, in step S321, the selected block is then exchanged with one of the lately-unused blocks within the data area 204, and the counting value is reset (for example, reset to 0). If the erase times of the selected block is judged to be less than the erase times of the comparison block selected from the spare area 206 plus the first threshold value according to the step S319, in step S323, the comparison block (which actually is the selected block after judgment) is then exchanged with one of the lately-unused blocks within the data area 204, and the counting value is reset (for example, reset to 0). Here, the term "exchange" means that the block selected from the spare area 206 is associated with the data area 204, and meanwhile association between the block selected from the spare area 206 and the spare area 206 is cancelled; and the block selected from the data area 204 is associated with the spare area 206, and meanwhile the association between the block selected from the data area 204 and the data area 204 is cancelled.

It should be noted that in another embodiment of the present invention, the steps S313~S315 of FIG. 3 may be simplified as: when a write or an erase instruction is executed, the counting value adds 1, and if the counting value is greater than the third threshold value, the aforementioned wear leveling procedure is performed; or the wear leveling procedure is performed when erase times of the block with the maximum erase times within the spare area 206>the average value between the maximum erase times and the minimum erase times among the erase times of the lately-used blocks plus a fourth threshold value. Wherein, the fourth is determined based on the wear leveling effect to be achieved.

In another embodiment of the present invention, the steps S313~S315 of FIG. 3 may be further simplified as: the aforementioned wear leveling procedure is performed according to a random mode.

In the present embodiment, in the step S321 and the step S323, the block is selected from the lately-unused blocks of the data area 204 according to a sequential mode, however, it should be understood that in another embodiment, the block may also be selected according to a random mode.

In an embodiment of the present invention, the step S317 may be performed by implementing a normal write instruction of the host by the controller 122. To be specific, in the present embodiment, when the step S317 is performed, the controller 122 may implement a write instruction, wherein the data to be write is a null set, so as to executing the write instruction (by which the aforementioned mother and son blocks may be generated) for exchanging the block of the spare area 206 with the block selected from the lately-unused blocks.

The wear leveling method of the present embodiment includes: the block used for the substitution-transient area 212 is selected from the spare area according to the judgment condition (step S1310); and the wear leveling procedure is performed (step S1320). However, in another embodiment of the present invention, the wear leveling method may include only managing and recording the erase times of the lately-used blocks and the blocks within the spare area in the buffer memory; and performing the wear leveling procedure, wherein the lately used blocks may be those blocks within the data area that write or erase is lately performed. In other words, under limited system resources, only the erase times of some specific blocks are recorded and managed, and the recorded information is used as the judgment condition during block selections.

Figure 4:
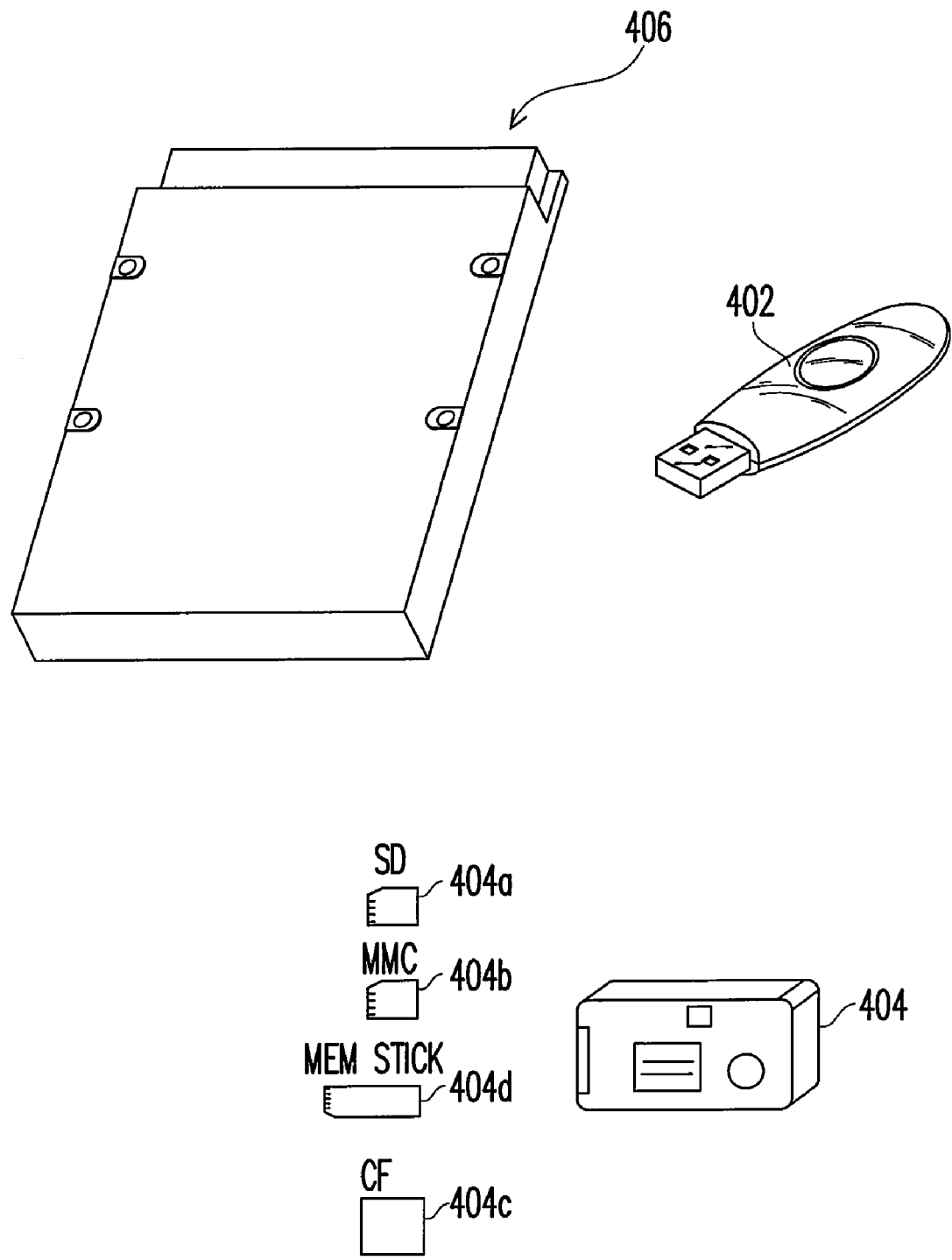
FIG. 4 is a schematic diagram illustrating devices using the wear leveling method of the present invention.

The wear leveling method provided by the present invention is suitable for the non-volatile memory, and therefore the wear leveling method of the present invention may be applied to any devices using the non-volatile memory as a storage media. For example, the wear leveling method may be applied to the devices shown in FIG. 4, such as an USB flash drive 402, a solid state drive 406 and a SD card 404a, a MMC card 404b, a CF card 404c and a memory stick 404d used for a digital camera (video camera) 404 etc. Wherein, the solid stat drive 406 especially requires a better wear leveling method.

In summary, the wear leveling method of the present invention applied to the non-volatile memory may effectively level wearing of the blocks within the memory, such that lifespan of the memory may be prolonged. Moreover, the total erase times according to the wear leveling method of the present invention is similar to that of the conventional method, which may not cause an extra erasing burden. However, compared to the conventional method, the method of the present invention may further level the erase times of the memory blocks.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A wear leveling method under limited system resources, for a non-volatile memory, wherein the non-volatile memory is substantially divided into a plurality of blocks, the blocks are at least grouped into a data area, a spare area and a substitution-transient area, and the blocks within the data area is divided into a plurality of lately-used blocks and a plurality of lately-unused blocks, the wear leveling method comprising:

a. recording erase times of the lately-used blocks and blocks within the spare area;

b. selecting a block for the substitution-transient area from the spare area according to a judgment condition of erase times of another block within the spare area plus a first threshold value; and c. performing a wear leveling procedure, wherein the selected block and the other block are selected in a random mode or a sequential mode.

2. The wear leveling method under limited system resources as claimed in claim 1, wherein the step of selecting the block according to the judgment condition comprises:

moving the selected block to the substitution-transient area if the erase times of the selected block≦the erase times of the other block within the spare area plus the first threshold value; and moving the other block to the substitution-transient area if the erase times of the selected block>the erase times of the other block within the spare area plus the first threshold value.

3. The wear leveling method under limited system resources as claimed in claim 1, wherein the wear leveling procedure comprises:
selecting a block from the spare area;
exchanging the selected block with one of the lately-unused blocks if the erased times of the selected block>the erase times of the other block within the spare area plus the first threshold value; and
exchanging the other block with one of the lately-unused blocks if the erase times of the selected block≦the erase times of the other block within the spare area plus the first threshold value.

4. The wear leveling method under limited system resources as claimed in claim 1, further comprising:
adding 1 to a counting value if the erase times of the block with a maximum erase times within the spare area>an average value between a maximum erase times and a minimum erase times among the erase times of the lately-used blocks plus a second threshold value; and
performing the step c. and resetting the counting value if the counting value is greater than a third threshold value.

5. The wear leveling method under limited system resources as claimed in claim 1, further comprising:
adding 1 to the counting value when a write or an erase instruction is implemented; and
performing the step c. and resetting the counting value if the counting value is greater than a third threshold value.

6. The wear leveling method under limited system resources as claimed in claim 1, further comprising:
performing the step c. if the erase times of the block with the maximum erase times within the spare area>the average value between the maximum erase times and the minimum erase times among the erase times of the lately-used blocks plus a fourth threshold value.

7. The wear leveling method under limited system resources as claimed in claim 1, further comprising:
performing the step c. in a random mode.

8. The wear leveling method under limited system resources as claimed in claim 2, further comprising:
increasing the erase times of the erased block when the block is erased.

9. The wear leveling method under limited system resources as claimed in claim 2, wherein the step of recording the erase times of the lately-used blocks and the blocks within spare area is performed in a system area which the blocks further are grouped into.

10. The wear leveling method under limited system resources as claimed in claim 1, further comprising: performing the step c. by implementing a normal writing instruction.

11. The wear leveling method under limited system resources as claimed in claim 3, wherein the step of selecting one of the lately-unused blocks is performed in a sequential mode or a random mode.

12. A controller, for a storage device, wherein a non-volatile memory of the storage device is substantially divided into a plurality of blocks, the blocks are at least grouped into a data area, a spare area and a substitution-transient area, and the blocks within the data area are divided into a plurality of lately-used blocks and a plurality of lately-unused blocks, the controller comprising:
a non-volatile memory interface, for accessing the non-volatile memory;
a buffer memory, for temporarily storing data;
a microprocessor unit, for controlling a whole operation of the controller; and
a memory management module, for managing the non-volatile memory,
wherein the memory management module records erase times of the lately-used blocks and blocks within the spare area, selects the block for the substitution-transient area from the spare area according to a judgment condition of erase times of another block within the spare area plus a first threshold value, and performs a wear levelling procedure, wherein the selected block and the other block are selected in a random mode or a sequential mode.

13. The controller as claimed in claim 12, wherein selecting the block according to the judgment condition by the memory management module comprises:
moving the selected block to the substitution-transient area if the erase times of the selected block≦the erase times of the other block within the spare area plus the first threshold value; and
moving the other block to the substitution-transient area if the erase times of the selected block>the erase times of the other block within the spare area plus the first threshold value.

14. The controller as claimed in claim 12, wherein the wear leveling procedure comprises:
selecting a block from the spare area;
exchanging the selected block with one of the lately-unused blocks if the erased times of the selected block>the erase times of the other block within the spare area plus the first threshold value; and
exchanging the other block with one of the lately-unused blocks if the erase times of the selected block≦the erase times of the other block within the spare area plus the first threshold value.

15. The controller as claimed in claim 12, wherein the wear leveling procedure further comprises:
adding 1 to a counting value if the erase times of the block with a maximum erase times within the spare area>an average value between a maximum erase times and a minimum erase times among the erase times of the lately-used blocks plus a second threshold value; and
performing the step c. and resetting the counting value if the counting value is greater than a third threshold value.

16. The controller as claimed in claim 12, wherein the memory management module adds 1 to a counting value when a write or an erase instruction is implemented, and performs the step c. and resets the counting value if the counting value is greater than the third threshold value.

17. The controller as claimed in claim 12, wherein the memory management module performs the step c. if the erase times of the block with a maximum erase times within the spare area>the average value between the maximum erase times and the minimum erase times among the erase times of the lately-used blocks plus a fourth threshold value.

18. The controller as claimed in claim 12, wherein the memory management module performs the step c. in a random mode.

19. The controller as claimed in claim 13, wherein the memory management module increases the erase times of the erased block when the block is erased.

20. The controller as claimed in claim 13, wherein the memory management module records the erase times of the lately-used blocks and the blocks within spare area in a system area which the blocks further are grouped into.

21. The controller as claimed in claim 12, wherein the memory management module performs the step c. by implementing a normal writing instruction.

22. The controller as claimed in claim 14, wherein the memory management module selects one of the lately-unused blocks in a sequential mode or a random mode.

23. The controller as claimed in claim 12, wherein the non-volatile memory comprises a single level cell (SLC) NAND flash memory and a multi level cell (MLC) NAND flash memory.

24. A wear leveling method under limited system resources, for a non-volatile memory, wherein the non-volatile memory is substantially divided into a plurality of blocks, the blocks are at least grouped into a data area and a spare area, and the blocks within the data area is divided into a plurality of lately-used blocks and a plurality of lately-unused blocks, the wear leveling method comprising:
 only managing and recording erase times of the lately-used blocks and blocks within the spare area in a buffer memory; and
 performing a wear leveling procedure.

25. The wear leveling method under limited system resources as claimed in claim 24, wherein the lately-used blocks are those blocks within the data area that write or erase is lately performed.

26. A controller, for a storage device, wherein a non-volatile memory of the storage device of the storage device is substantially divided into a plurality of blocks, the blocks are at least grouped into a data area and a spare area, and the blocks within the data area is divided into a plurality of lately-used blocks and a plurality of lately-unused blocks, the controller comprising:
 a non-volatile memory interface, for accessing the non-volatile memory;
 a buffer memory, for temporarily storing data;
 a microprocessor unit, for controlling a whole operation of the controller; and
 a memory management module, for managing the non-volatile memory,
 wherein the memory management module only manages and records erase times of the lately-used blocks and blocks within the spare area in a buffer memory, and
 the memory management module performs a wear leveling procedure.

* * * * *